(12) United States Patent
Okabe et al.

(10) Patent No.: US 8,124,880 B2
(45) Date of Patent: Feb. 28, 2012

(54) CIRCUIT BOARD AND METHOD FOR MANUFACTURING THEREOF

(75) Inventors: Shuhichi Okabe, Gyunggi-Do (KR);
Myung-Sam Kang, Suwon-si (KR);
Jung-Hyun Park, Suwon-si (KR);
Hoe-Ku Jung, Daejeon (KR);
Jeong-Woo Park, Suwon-si (KR);
Ji-Eun Kim, Gwangmyeong-si (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 1160 days.

(21) Appl. No.: 11/976,207

(22) Filed: Oct. 22, 2007

(65) Prior Publication Data

US 2008/0264676 A1    Oct. 30, 2008

(30) Foreign Application Priority Data

Oct. 25, 2006  (KR) .......................... 10-2006-0104203

(51) Int. Cl.
*H05K 1/03* (2006.01)
(52) U.S. Cl. ........................................................ 174/255
(58) Field of Classification Search .................. 174/255; 29/830–831, 846–847, 852
See application file for complete search history.

(56) References Cited

U.S. PATENT DOCUMENTS

| | | | |
|---|---|---|---|
| 5,184,399 A | 2/1993 | Ueno et al. | |
| 6,754,952 B2 * | 6/2004 | Takano et al. | 29/852 |
| 2007/0074902 A1 * | 4/2007 | Hirata | 174/262 |

FOREIGN PATENT DOCUMENTS

| | | |
|---|---|---|
| JP | 53-100468 | 1/1978 |
| JP | 61-82497 | 4/1986 |
| JP | 2-159789 | 6/1990 |
| JP | 5-152764 | 6/1993 |
| JP | 2006-147881 | 6/2006 |

OTHER PUBLICATIONS

Korean Patent Office Action, mailed Nov. 28, 2007 and issued in corresponding Korean Patent Application No. 10-2006-0104203.
Japanese Office Action issued Feb. 9, 2010 in corresponding Japanese Patent Application 2007-276875.
Chinese Office Action issued on Aug. 26, 2011 in corresponding Chinese Patent Application No. 201010148337.9.

* cited by examiner

*Primary Examiner* — Jeremy Norris
*Assistant Examiner* — Tremesha S Willis

(57) ABSTRACT

A method of manufacturing a circuit board that includes: forming a conductive relievo pattern, including a first plating layer, a first metal layer, and a second plating layer stacked sequentially in correspondence with a first circuit pattern, on a seed layer stacked on a carrier; stacking and pressing together the carrier and an insulator, such that a surface of the carrier having the conductive relievo pattern faces the insulator; transcribing the conductive relievo pattern into the insulator by removing the carrier; forming a conduction pattern, including a third plating layer and a second metal layer stacked sequentially in correspondence with a second circuit pattern, on the surface of the insulator having the conductive relievo pattern transcribed; removing the first plating layer and seed layer; and removing the first and second metal layers, can provide a circuit board that has high-density circuit patterns without an increased amount of insulator.

8 Claims, 21 Drawing Sheets

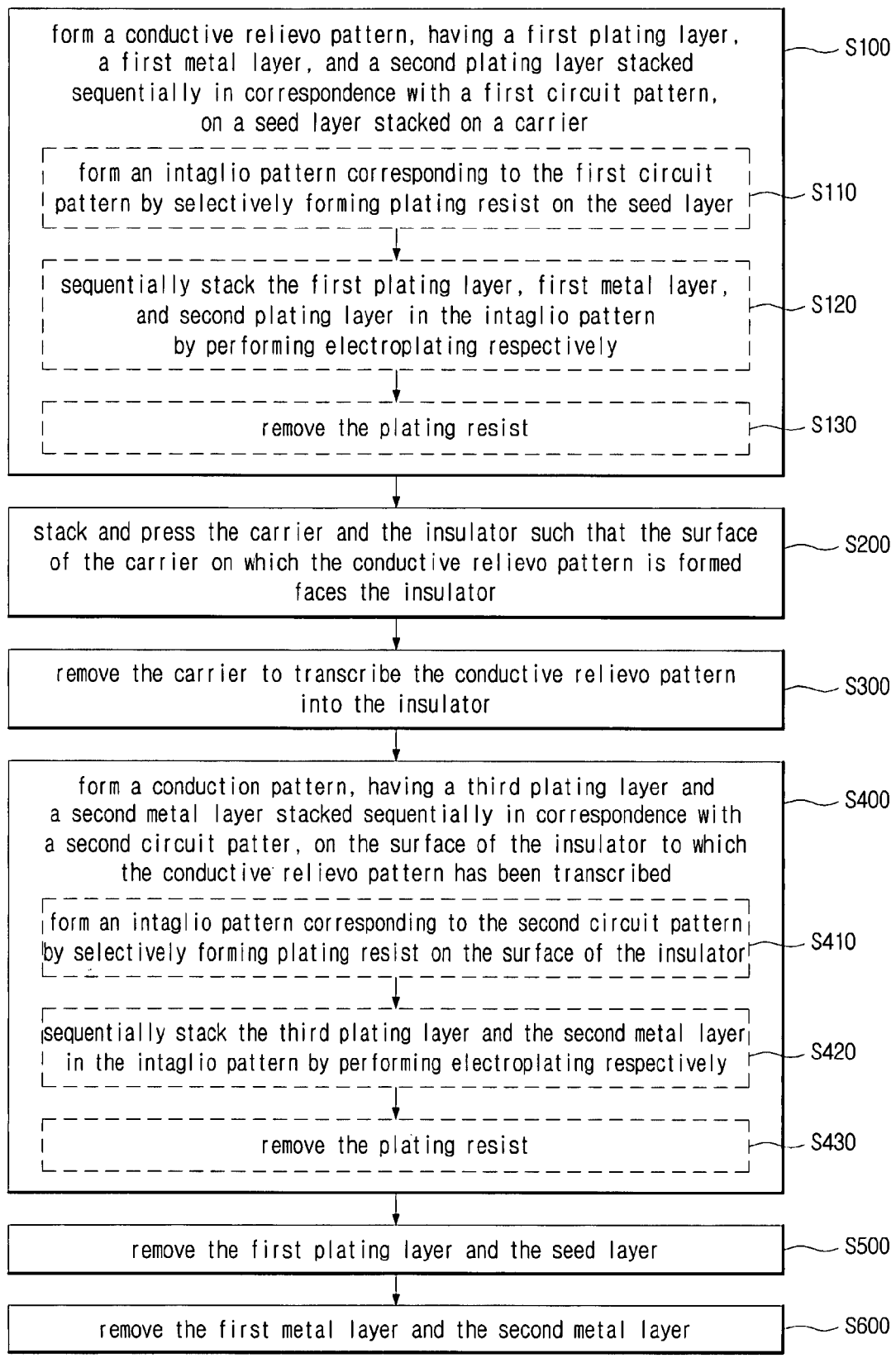

CIRCUIT BOARD AND METHOD FOR MANUFACTURING THEREOF

CROSS-REFERENCE TO RELATED APPLICATIONS

This application claims the benefit of Korean Patent Application No. 10-2006-0104203 filed with the Korean Intellectual Property Office on Oct. 25, 2006, the disclosure of which is incorporated herein by reference in its entirety.

BACKGROUND

1. Technical Field

The present invention relates to a circuit board and a method for the manufacturing of a circuit board.

2. Description of the Related Art

With electronic products trending towards smaller, thinner, higher-density, and packaged products, so also is the circuit board undergoing a trend towards finer patterns and smaller and packaged products. Accordingly, along with changes in the raw materials for forming fine patterns on the multilayer printed circuit board and for improving reliability and design density, there is a change towards integrating the layer composition of circuits. Components are also undergoing a change from DIP (dual in-line package) types to SMT (surface mount technology) types, so that the mounting density is also being increased.

In response to the growing complexity of circuits and the demands for high-density and fine-line circuits, various forms of multilayer circuit boards are being proposed. However, the conventional manufacturing process for multilayer circuit boards may involve complicated processes and may require a minimum pitch between adjacent circuits, for example because of ion migration, etc., so that there may be a limit to forming fine-line circuit patterns.

Also, the multilayer circuit board may have a high thickness, making it difficult to implement thin boards, while undercuts may occur at the attachment portions between the circuits and the board, causing the circuits to be peeled off from the board.

SUMMARY

An aspect of the invention is to provide a circuit board and a method for manufacturing thereof, in which a double layer of circuit patterns, one circuit pattern buried in the insulator and one circuit pattern formed on the outer layer, are formed without increasing the amount of insulator, to offer high-density circuit patterns.

Also, another aspect of the invention is to provide a circuit board and a method for manufacturing thereof, in which a level difference is formed between the circuit pattern buried in the insulator and the circuit pattern formed on the outer layer, to reduce the pitch between adjacent circuits and thus form fine-line circuit patterns of a high density.

One aspect of the invention provides a method of manufacturing a circuit board that includes: forming a conductive relievo pattern on a seed layer stacked on a carrier, where the conductive relievo pattern includes a first plating layer, a first metal layer, and a second plating layer stacked sequentially in correspondence with a first circuit pattern; stacking and pressing together the carrier and an insulator, such that a surface of the carrier on which the conductive relievo pattern is formed faces the insulator; transcribing the conductive relievo pattern into the insulator by removing the carrier; forming a conduction pattern on the surface of the insulator on which the conductive relievo pattern is transcribed, where the conduction pattern includes a third plating layer and a second metal layer stacked sequentially in correspondence with a second circuit pattern; removing the first plating layer and the seed layer; and removing the first metal layer and the second metal layer.

The first plating layer, second plating layer, and third plating layer may be formed from the same metal material as that of the seed layer, while the first metal layer and the second metal layer may be formed from a different metal material from that of the seed layer. In this case, the seed layer may contain copper (Cu), and the first metal layer and the second metal layer may contain at least one or more of tin (Sn) and nickel (Ni).

Forming the conductive relievo pattern may include: forming an intaglio pattern corresponding to the first circuit pattern by selectively forming plating resist on the seed layer; sequentially stacking the first plating layer, the first metal layer, and the second plating layer in the intaglio pattern by performing electroplating respectively; and removing the plating resist.

The carrier may be a metal plate, in which case the transcribing may be achieved by etching the metal plate.

Forming the conduction pattern may include: forming an intaglio pattern corresponding to the second circuit pattern by selectively forming plating resist on the surface of the insulator; sequentially stacking the third plating layer and the second metal layer in the intaglio pattern by performing electroplating respectively; and removing the plating resist.

In certain embodiments, forming the conductive relievo pattern may include forming a conductive relievo pattern on each seed layer of two carriers, the stacking and pressing may include stacking and pressing the two carriers onto either surface of the insulator such that the surface of each carrier on which the conductive relievo pattern is formed faces the insulator, the transcribing may include removing the two carriers, and forming the conduction pattern may include forming a conduction pattern on either surface of the insulator.

The method of manufacturing a circuit board may then further include forming a via hole in the insulator and forming a seed layer in the via hole, before forming the conduction pattern on either surface of the insulator, and may further include selectively applying solder resist on the insulator, after the forming of the conduction pattern.

Another aspect of the invention provides a circuit board that includes: an insulator which includes a trench, a first circuit pattern formed to bury a portion of the trench, and a second circuit pattern formed on the surface of the insulator in which the trench is formed.

The first circuit pattern and the second circuit pattern may be formed on both surfaces of the insulator.

The circuit board may include a via for electrically connecting the first circuit patterns formed on either surface of the insulator.

In some cases, a portion of the second circuit pattern may be formed to overlap a portion of the first circuit pattern.

Additional aspects and advantages of the present invention will be set forth in part in the description which follows, and in part will be obvious from the description, or may be learned by practice of the invention.

BRIEF DESCRIPTION OF THE DRAWINGS

FIG. 2A, FIG. 2B, FIG. 2C, FIG. 2D, FIG. 2E, FIG. 2F, FIG. 2G, FIG. 2H, FIG. 2I, FIG. 2J, and FIG. 2K represent a flow diagram illustrating a method of manufacturing a circuit board according to an embodiment of the present invention.

FIG. 4 is a flowchart illustrating a method of manufacturing a circuit board according to an embodiment of the present invention.

DETAILED DESCRIPTION

Figure 1:
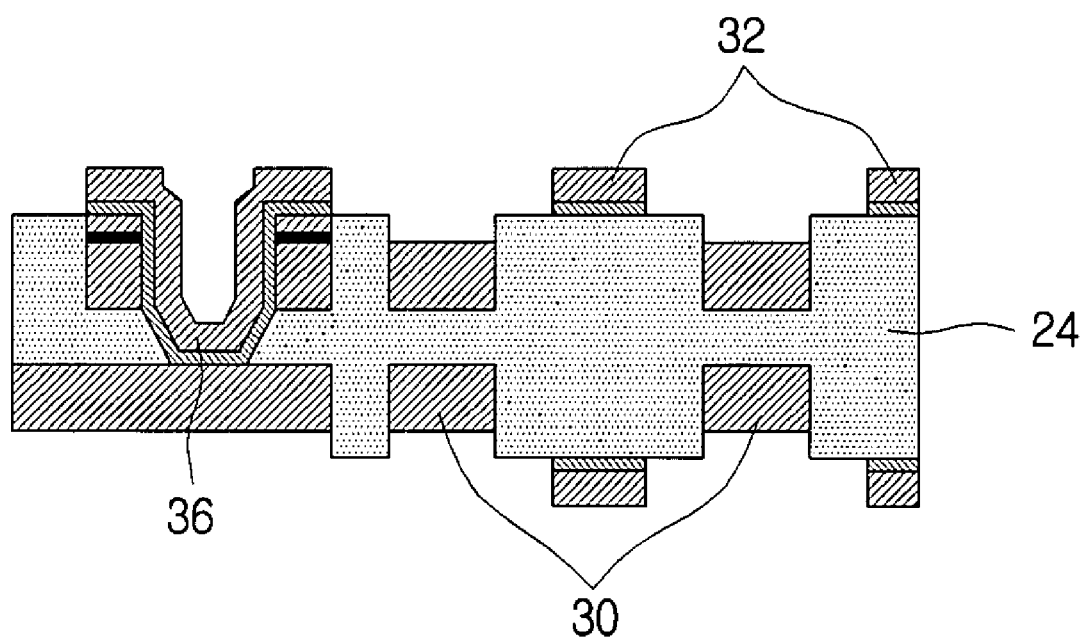
FIG. 1 is a cross-sectional view of a circuit board according to an embodiment of the present invention.

The circuit board and method for manufacturing thereof according to certain embodiments of the invention will be described below in more detail with reference to the accompanying drawings, in which those components are rendered the same reference numeral that are the same or are in correspondence, regardless of the figure number, and redundant explanations will be omitted.

FIG. 1 is a cross-sectional view of a circuit board according to an embodiment of the present invention. In FIG. 1 are illustrated an insulator 24, first circuit patterns 30, second circuit patterns 32, and a via 36.

As electronic products are becoming smaller and thinner and being provided with higher density, so also is the circuit board undergoing a trend towards finer patterns and smaller products. The higher density and finer patterns in the circuit patterns of a circuit board cause the distance between circuit lines to become narrower (The distance between the center of a circuit line and the center of an adjacent circuit line is referred to as the "pitch."), whereby short-circuiting or defective insulation may occur due to the movement of ions, etc. Therefore, in manufacturing fine-line circuit patterns, a minimum pitch may need to be maintained between adjacent circuit lines in order to prevent such short-circuiting or defective insulation in a circuit, which may impose a limit on forming fine-line circuit patterns.

This embodiment provides a circuit board having high-density circuit patterns without an increased amount of insulator 24, by forming a double layer of circuit patterns from a first circuit pattern 30 buried in the insulator 24 and a second circuit pattern 32 formed on the outer layer of the insulator 24. That is, a circuit board is presented in which fine-line circuit patterns of a high density may be formed by creating a level difference between the first circuit pattern 30, which is buried in the insulator 24, and the second circuit pattern 32, which is formed on the outer layer of the insulator 24, to decrease the distance between adjacent circuit lines. Here, the difference in level between the first circuit pattern 30 buried in the insulator 24 and the second circuit pattern 32 formed on the outer layer of the insulator 24 may be formed to be greater than a particular distance, to prevent the occurrence of electrical short-circuiting.

A circuit board according to this embodiment may include an insulator 24, in which trenches are formed that correspond to a first circuit pattern 30, a first circuit pattern 30 formed to bury a portion of the trenches, and a second circuit pattern 32 formed on the surface of the insulator 24 in which the trenches are formed, with a level difference above a certain distance formed between the first circuit pattern 30 and second circuit pattern 32.

While a particular amount of pitch may be required between circuit lines formed in the same plane, the circuit board according to this embodiment may have the first circuit pattern 30 and second circuit pattern 32 formed on two planes that form a particular difference in level, to render the effect of forming a pitch greater than a certain distance. This configuration makes it possible to provide a circuit board having circuit patterns of high density.

It should be noted that, as illustrated in FIG. 1, it is possible to form a first circuit pattern 30 and a second circuit pattern 32 on both surfaces of the insulator 24 such that four layers of circuit patterns may be formed for one insulator 24. In this case, the first circuit pattern 30 formed on either surface of the insulator 24 can be connected by a via 36 to enable electrical conduction.

Also, a portion of the first circuit pattern 30 can be made to overlap a portion of the second circuit pattern 32 (see the portion where the via 36 is formed in FIG. 1) for electrical connection between the first circuit pattern 30 and the second circuit pattern 32 formed on one surface of the insulator 24.

FIGS. 2A to 2K represent a flow diagram illustrating a method of manufacturing a circuit board according to an embodiment of the present invention. In FIGS. 2A to 2K are illustrated a carrier 12, a seed layer 14, plating resist 16, a first plating layer 18, a first metal layer 20, a second plating layer 22, a conductive relievo pattern 21, an insulator 24, a third plating layer 26, a second metal layer 28, a conduction pattern 27, a first circuit pattern 30, and a second circuit pattern 32.

This embodiment may provide a method of manufacturing a circuit board having high-density circuit patterns without increasing the amount of insulator 24, by forming a double layer of circuit patterns from a first circuit pattern 30 buried in the insulator 24 and a second circuit pattern 32 formed on the outer layer of the insulator 24.

That is, a conductive relievo pattern 21, formed by sequentially stacking the first plating layer 18, first metal layer 20, and second plating layer 22, may be formed in correspondence with the first circuit pattern 30 on the seed layer 14 stacked on the carrier 12. The surface of the carrier 12 having the conductive relievo pattern 21 may be made to face the insulator 24, and the carrier 12 and the insulator 24 may be stacked and pressed together, after which removing the carrier 12 may result in the conductive relievo pattern 21 being transcribed into the surface of the insulator 24.

Next, the conduction pattern 27, formed by sequentially stacking the third plating layer 26 and the second metal layer 28, may be formed in correspondence with the second circuit pattern 32 on the surface of the insulator 24 to which the conductive relievo pattern 21 is transcribed, after which the first plating layer 18 and the seed layer 14 may be removed.

By removing the first metal layer 20 and second metal layer 28 afterwards, the circuit board can be manufactured that has a first circuit pattern 30 buried to a particular depth in the surface of the insulator 24 and a second circuit pattern 32 formed on the surface of the insulator 24.

Figure 2A:
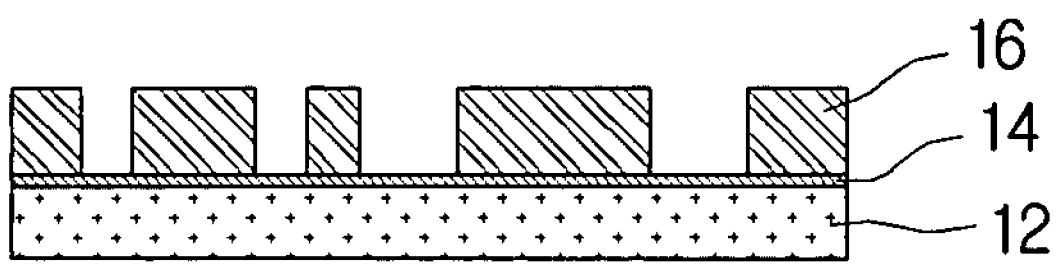
Figure 2B:
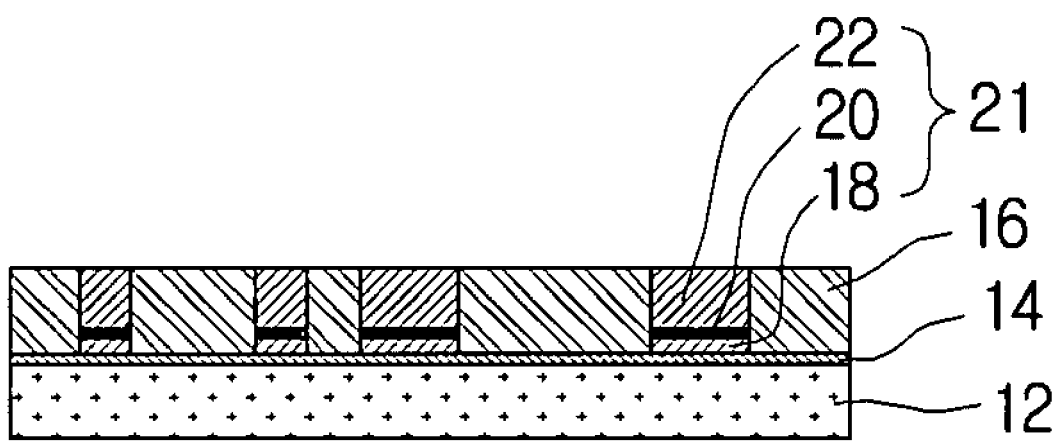
Figure 2C:
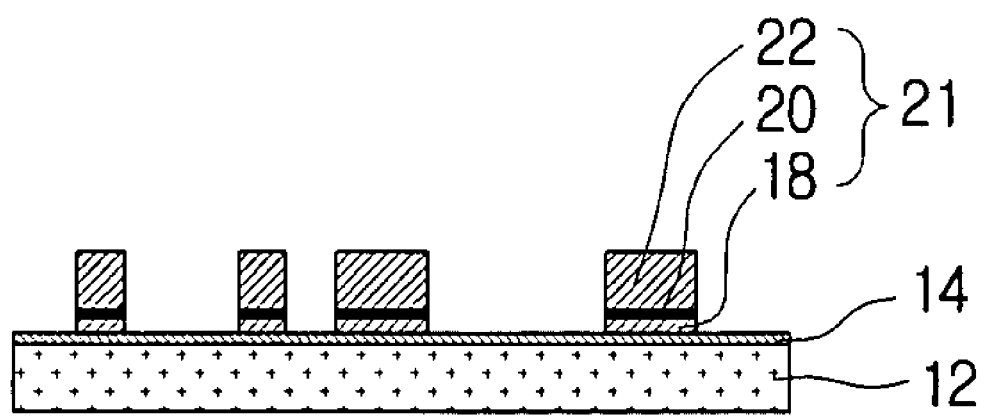
Figure 2D:
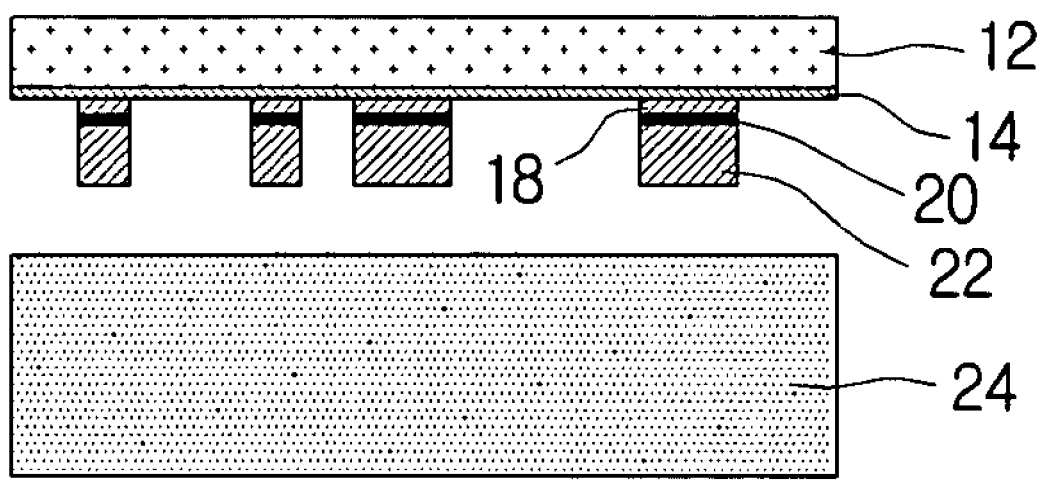
Figure 2E:
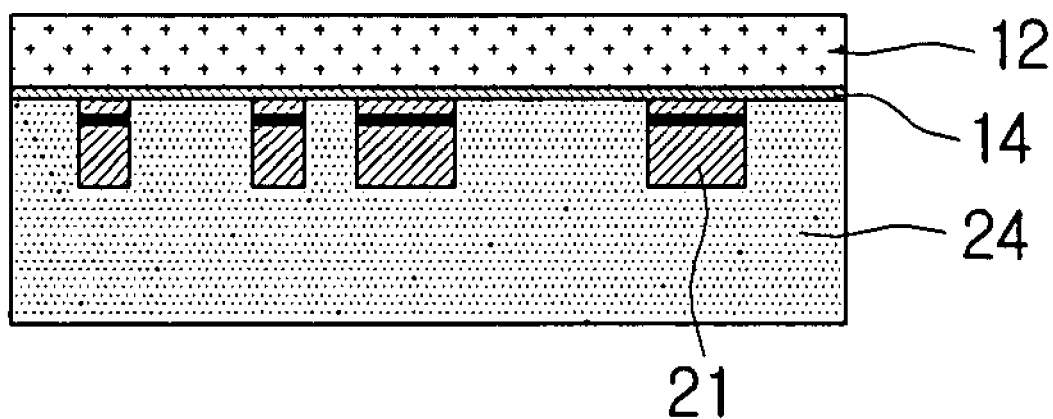

Referring to FIGS. 2A, 2B, and 2C, forming the conductive relievo pattern 21 having the first plating layer 18, first metal layer 20, and second plating layer 22 stacked in order on the seed layer 14 stacked on the carrier 12, such that the conductive relievo pattern 21 is in correspondence with the first circuit pattern 30, may be performed as follows. Plating resist 16 may be formed selectively on the seed layer 14 to form an intaglio pattern corresponding to the first circuit pattern 30 (FIG. 2A), the first plating layer 18, first metal layer 20, and second plating layer 22 may be stacked in order within the intaglio pattern by performing electroplating for each using the seed layer 14 as an electrode (FIG. 2B), and then the plating resist 16 may be removed to form a conductive relievo pattern 21 that corresponds with the first circuit pattern 30 (FIG. 2C).

The method of forming the conductive relievo pattern 21 on the seed layer 14 of the carrier 12 to correspond with the first circuit pattern 30 may include coating a photosensitive material on the seed layer 14 of the carrier 12, fabricating a photomask in correspondence with the first circuit pattern 30, and afterwards positioning the photomask on the seed layer 14 coated with photosensitive material and exposing to ultraviolet rays. After the exposure, the non-cured portions of the photosensitive material may be developed using, for example, developing liquid, to form the intaglio pattern on the seed layer 14 that matches the first circuit pattern 30 (FIG. 2A).

By selectively exposing and developing a photosensitive film layer stacked on the seed layer 14 of the carrier 12, the non-cured portions of the photosensitive film layer that have not been exposed due to the photomask are removed from the seed layer 14 of the carrier 12, whereas the portions of the photosensitive film layer that have been cured due to the exposure remain, whereby an intaglio pattern can be formed that corresponds with the first circuit pattern 30.

A photosensitive film layer (for example, the photosensitive film may be a dry film) may be used for the photosensitive material stacked on the seed layer 14 of the carrier 12, which may then be formed into the intaglio pattern corresponding to the desired first circuit pattern 30 by selective exposure and development using a photomask of artwork film, etc. It is also possible to form a photosensitive film layer by applying photosensitive liquid over the seed layer 14 of the carrier 12.

When the intaglio pattern corresponding to the first circuit pattern 30 is formed on the seed layer 14 of the carrier 12, the first plating layer 18 may first be formed in the intaglio pattern by performing electroplating using the seed layer 14 as an electrode. When the first plating layer 18 is stacked, the first metal layer 20 may be stacked by electroplating.

The first metal layer 20 may include at least one or more of tin and nickel. Here, the first plating layer 18 and first metal layer 20 may be formed only in a portion of the intaglio pattern. Because the height to which the first plating layer 18 and the first metal layer 20 are stacked in the intaglio pattern forms the particular level difference between the first circuit pattern 30 and the second circuit pattern 32 as the first plating layer 18 and the first metal layer 20 are removed in a subsequent process, the first plating layer 18 and the first metal layer 20 may be stacked to a height that does not incur electrical short-circuiting.

When the first plating layer 18 and the first metal layer 20 of a particular depth are stacked in the intaglio pattern, the second plating layer 22 may be stacked on top. The second plating layer 22 may later become the first circuit pattern 30 when the first plating layer 18 and the first metal layer 20 are removed (FIG. 2B).

A conductive material apparent to those skilled in the art may be used for the first plating layer 18 and second plating layer 22, such as aluminum (Al), silver (Ag), copper (Cu), chromium (Cr), etc. For example, copper (Cu) may be used for the seed layer 14, which may be used as an electrode in performing electroplating to stack the first plating layer 18 and second plating layer 22 in the intaglio pattern.

The first metal layer 20 and the second metal layer 28 can be formed from a different metal from the materials used for the first through third plating layers 18, 22, 26, so that they can serve as etching resist when removing the first plating layer 18 and the seed layer 14 as will be described later.

The first metal layer 20 and second metal layer 28 can contain at least one or more of tin (Sn) and nickel (Ni). That is, the metal layers can be made from tin (Sn) or nickel (Ni), the tin (Sn) can be formed with the nickel (Ni) formed over it in addition, or the nickel (Ni) can be formed with the tin (Sn) formed over it in addition. Of course, it is also possible to form the first metal layer 20 and second metal layer 28 from different metals.

After the first plating layer 18, first metal layer 20, and second plating layer 22 are stacked in order in the intaglio pattern, the plating resist 16 may be removed to form the conductive relievo pattern 21 on the seed layer 14 of the carrier 12 in correspondence to the first circuit pattern 30 (FIG. 2C).

Figure 2F:
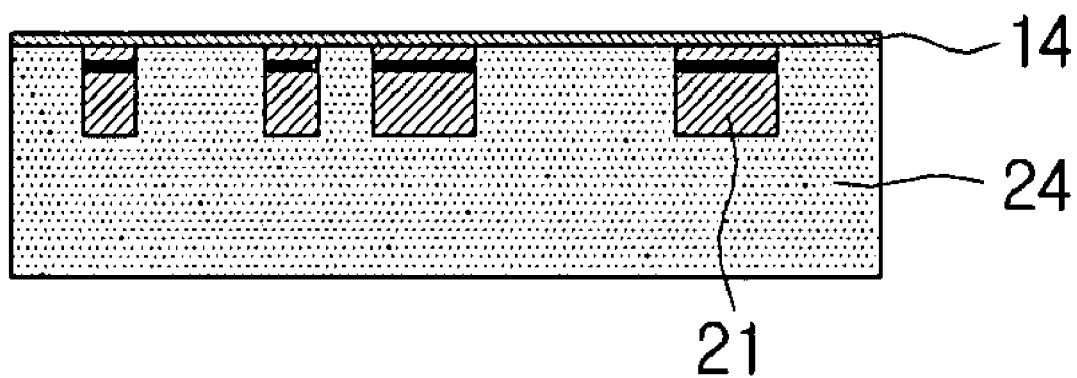
Figure 2G:
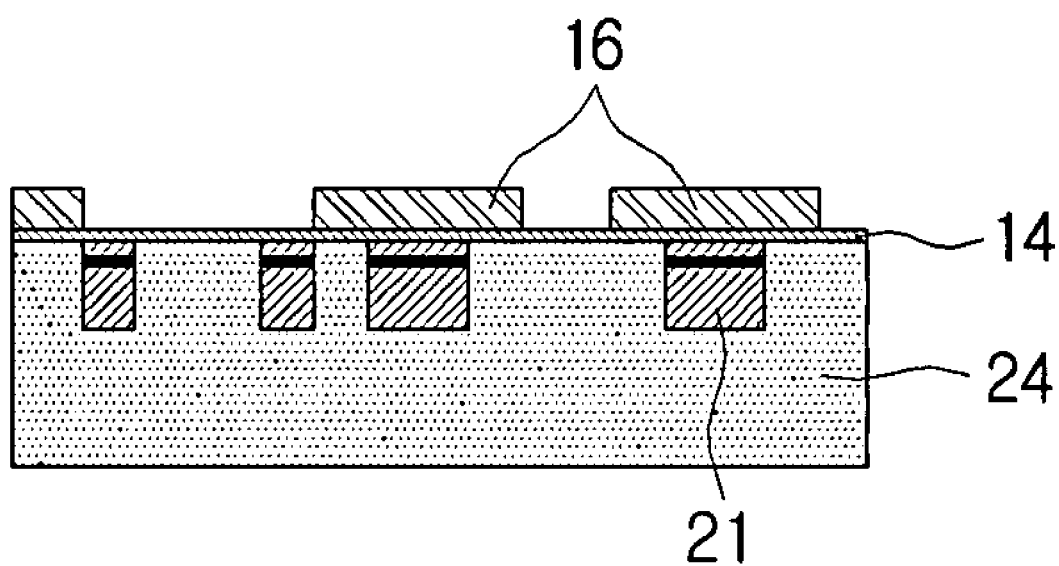
Figure 2H:
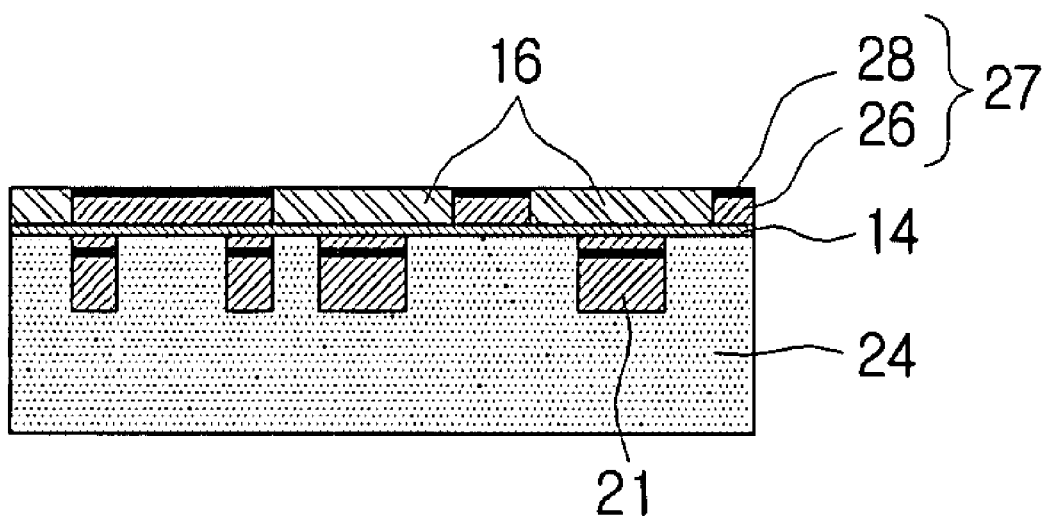
Figure 21:
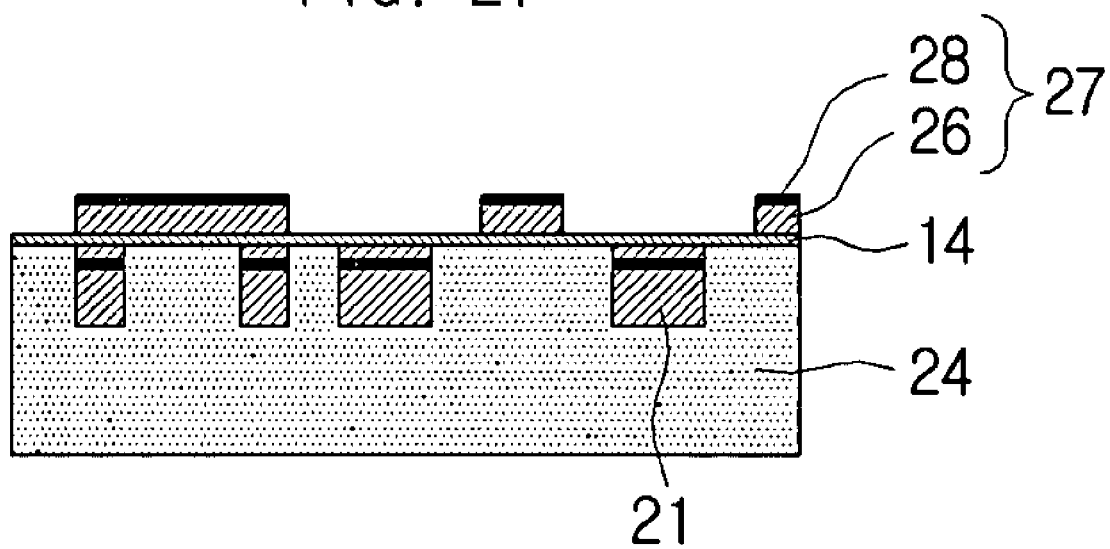

When the conductive relievo pattern 21 is formed on the seed layer 14 of the carrier 12, the carrier 12 and the insulator 24 may be stacked and pressed with the surface of the carrier 12 having the conductive relievo pattern 21 facing the insulator 24, such that the conductive relievo pattern 21 is pressed into the insulator 24 (FIGS. 2D and 2E), after which removing the carrier 12 may result in the conductive relievo pattern 21 being buried and transcribed into the surface of the insulator 24. Here, the seed layer 14 that was stacked on the surface of the carrier 12 may also be transferred (FIG. 2F).

The insulator 24 may include at least one of thermoplastic resin and glass epoxy resin, and when the conductive relievo pattern 21 is being buried into the insulator 24, the insulator 24 may be in a softened state. That is, after softening the insulator 24 by raising the temperature to the softening temperature of the thermoplastic and/or glass epoxy resin, the conductive relievo pattern 21 formed in relief in the seed layer 14 of the carrier 12 may be pressed into the softened insulator 24. It is also possible to use prepreg as the insulator 24, in which thermosetting resin is impregnated in glass fibers to provide a semi-cured state.

With regards methods of removing the carrier 12, if the carrier 12 is made of a metal plate, the removal may involve etching the metal plate, or if the carrier 12 is made of a film such as of resin, etc., and is attached to the insulation layer by a thermoplastic adhesive, it is possible to separate the carrier 12 by applying a certain temperature such that decreases the adhesion of the adhesive.

When the conductive relievo pattern 21 is transcribed into the surface of the insulator 24, the conduction pattern 27, which can be made by sequentially stacking a third plating layer 26 and a second metal layer 28, may be formed on a surface of the insulator 24 in correspondence to a second circuit pattern 32.

That is, an intaglio pattern may be formed in a surface of the insulator 24 in correspondence with a second circuit pattern 32 by selectively forming plating resist (FIG. 2G), the third plating layer 26 and the second metal layer 28 may be sequentially stacked by performing electroplating (FIG. 2H), and then the plating resist 16 may be removed to form the conduction pattern 27 on the surface of the insulator 24 in correspondence with the second circuit pattern 32 (FIG. 2I).

The method of forming an intaglio pattern that corresponds to the second circuit pattern 32 may be the same as the method of forming an intaglio pattern in the seed layer 14 that corresponds to the first circuit pattern 30, and thus will not be described in further detail.

When the intaglio pattern is formed that corresponds to the second circuit pattern 32, the third plating layer 26 and second metal layer 28 may be stacked in order in the intaglio pattern. In removing the carrier 12 from the insulator 24, as described above, the seed layer 14 that used to be on the surface of the carrier 12 can also be transferred to the insulator 24. This seed layer 14 can be used as an electrode to perform electroplating to stack the third plating layer 26 and then the second metal layer 28.

A conductive material apparent to those skilled in the art may be used for the third plating layer 26, such as aluminum (Al), silver (Ag), copper (Cu), chromium (Cr), etc. For example, copper (Cu) may be used for the seed layer 14, which may be used as an electrode in performing electroplating to stack the third plating layer 26 in the intaglio pattern. When the first metal layer 20 and second metal layer 28 are removed in a subsequent process, the third plating layer 26 may become the second circuit pattern 32 formed on the surface of the insulator 24.

The second metal layer 28 can be made of the same material as that of the first metal layer 20, so that the first metal layer 20 and the second metal layer 28 can be removed simultaneously by a single etching process when removing the first and second metal layers 20, 28.

The conduction pattern 27 may be formed to have a portion overlapping the conductive relievo pattern 21 pressed in from the surface of the insulator 24. By thus having a portion overlap the conductive relievo pattern, the first circuit pattern 30 and second circuit pattern 32 that will be formed in a subsequent process can be electrically connected. That is, in order to have a portion of the conduction pattern 27 overlap a portion of the conductive relievo pattern 21 pressed in from the surface of the insulator 24, a portion of the intaglio pattern corresponding to the second circuit pattern 32 can be formed over the conductive relievo pattern 21, at which stacking the third plating layer 26 and the second metal layer 28 in the intaglio pattern can result in a portion of the conductive relievo pattern 21 overlapping a portion of the conduction pattern 27 such that they are electrically connected.

Figure 2J:
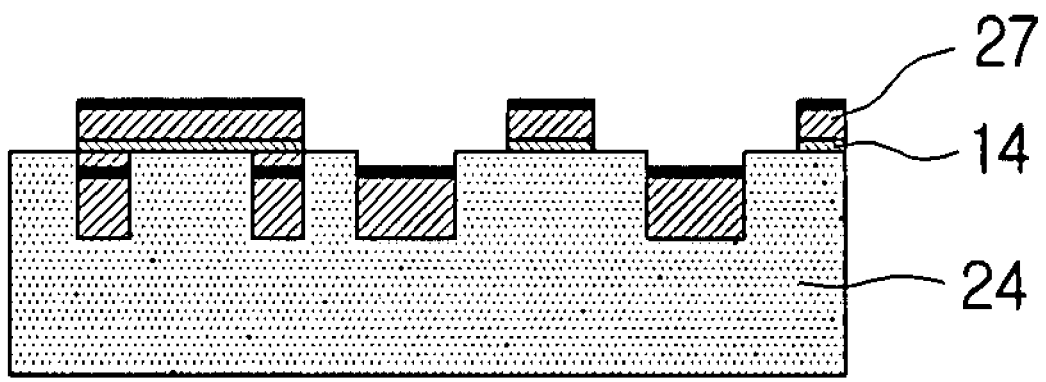

After the forming the conduction pattern 27, made by stacking the third plating layer 26 and second metal layer 28 in order, on the surface of the insulator 24 in correspondence with the second circuit pattern 32, the first plating layer 18 and the seed layer 14 may be removed. The first plating layer 18 can be formed by electroplating using the seed layer 14 as an electrode, and the first plating layer 18 and the seed layer 14 can be made from the same metal so that they can be removed simultaneously by a single instance of etching. Here, the first metal layer 20 and second metal layer 28 can be made from a metal material different from the seed layer 14, to function as a resist to the etching of the first plating layer 18 and seed layer 14, so that the areas where the first metal layer 20 or the second metal layer 28 are formed may not be etched (FIG. 2J).

Figure 2K:
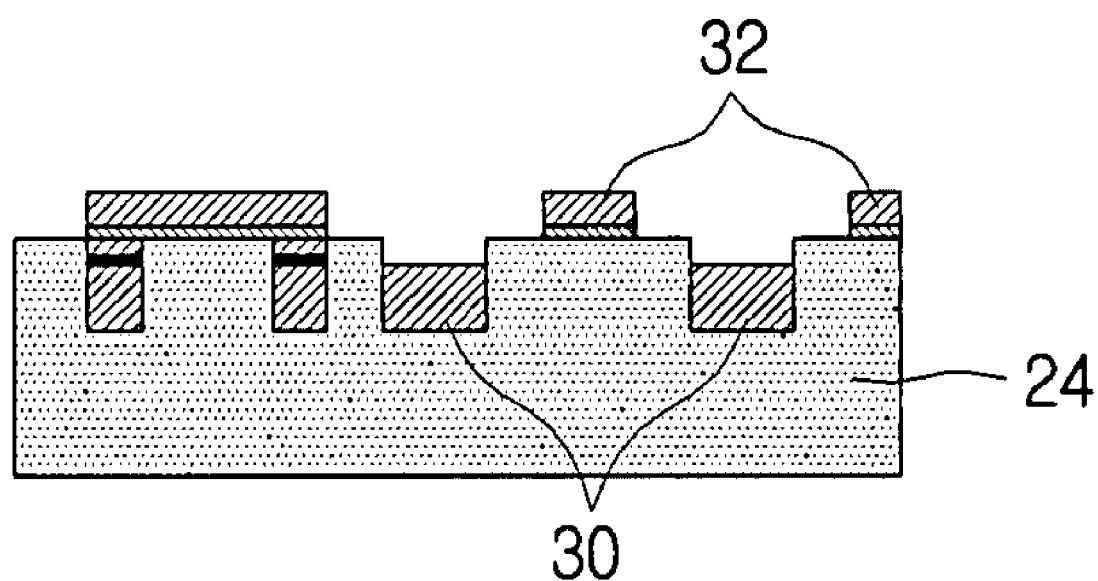

After removing the first plating layer 18 and the seed layer 14, the first metal layer 20 and second metal layer 28 may be removed. If the first metal layer 20 and second metal layer 28 are made from different metal materials, an etchant can be applied respectively for each metal to remove the first and second metal layers 20, 28 individually, and if the first metal layer 20 and second metal layer 28 are of the same metal, they can be removed simultaneously by one instance of etching. In terms of reducing the time for the etching process, it may be desirable to form the first and second metal layers 20, 28 from the same metal (FIG. 2K).

As the first plating layer 18, seed layer 14, and first metal layer 20 are removed, a level difference can be formed commensurate to the height of the first plating layer 18 and the first metal layer 20, and the second plating layer 22 can be buried in the insulator 24 by a particular depth to form the first circuit pattern 30. Also, as the second metal layer 28 is removed, the third plating layer 26 can be formed on the surface of the insulator 24 to form the second circuit pattern 32.

When the first circuit pattern 30 and the second circuit pattern 32 are formed with a difference in level of a particular distance, electrical short-circuiting can be avoided, even when the first circuit pattern 30 is formed directly adjacent to the second circuit pattern 32, whereby the circuit board can be manufactured that has circuit patterns formed in high density.

FIGS. 3A to 3H represent a flow diagram illustrating a method of manufacturing a circuit board according to another embodiment of the present invention. In FIGS. 3A to 3H are illustrated carriers 12, seed layers 14, plating resist 16, conductive relievo patterns 21, an insulator 24, third plating layers 26, second metal layers 28, conduction patterns 27, first circuit patterns 30, second circuit patterns 32, a via hole 34, and a via 36.

This embodiment provides a method of manufacturing a circuit board of a four-layer structure by forming two layers of circuit patterns each on either surface of the insulator 24 using two carriers 12.

Figure 3A:
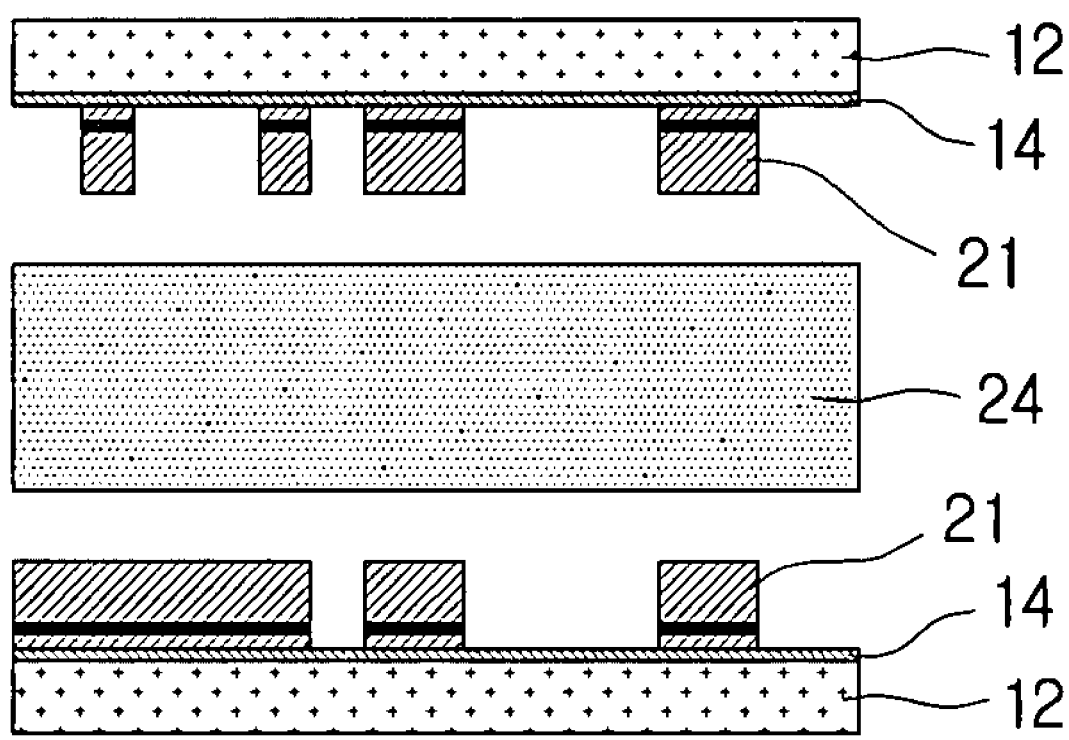
FIG. 3A, FIG. 3B, FIG. 3C, FIG. 3D, FIG. 3E, FIG. 3F, FIG. 3G, and FIG. 3H represent a flow diagram illustrating a method of manufacturing a circuit board according to another embodiment of the present invention.
Figure 3B:
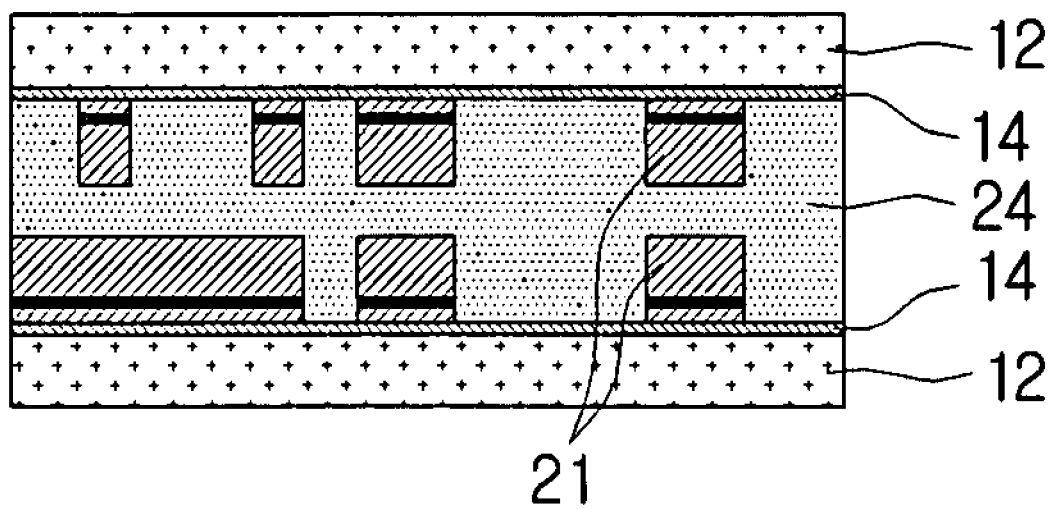
Figure 3C:
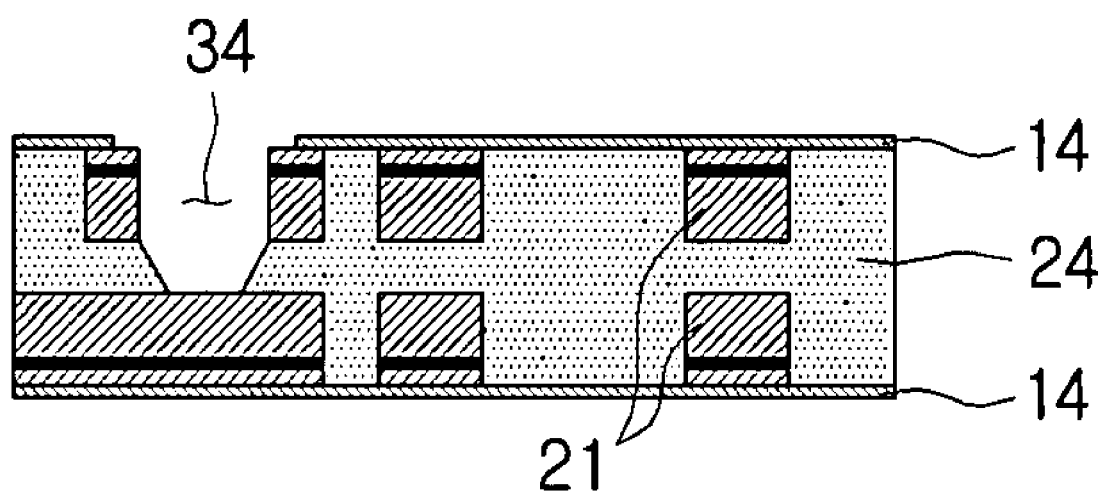
Figure 3D:
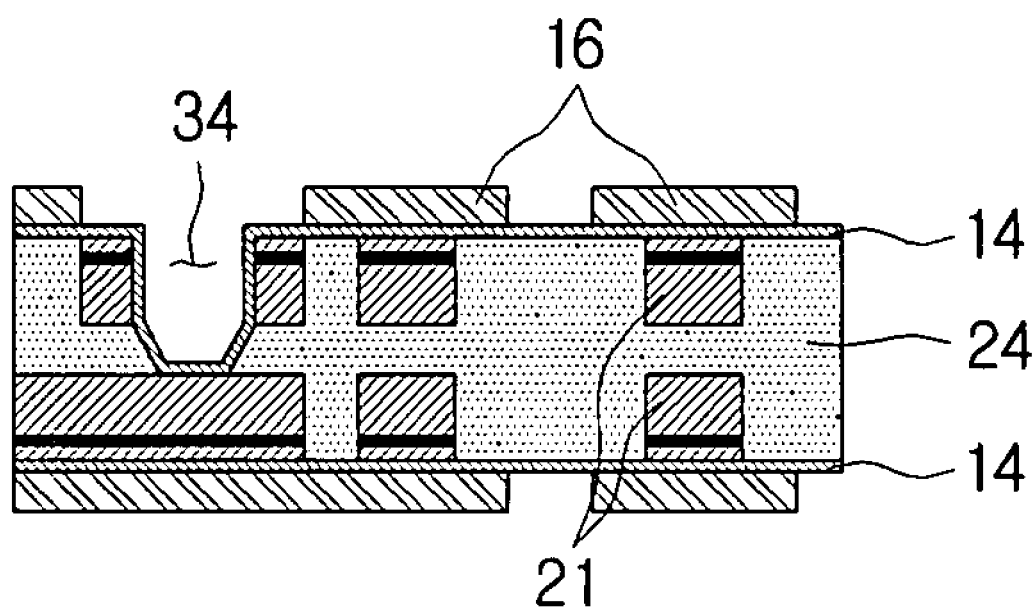
Figure 3E:
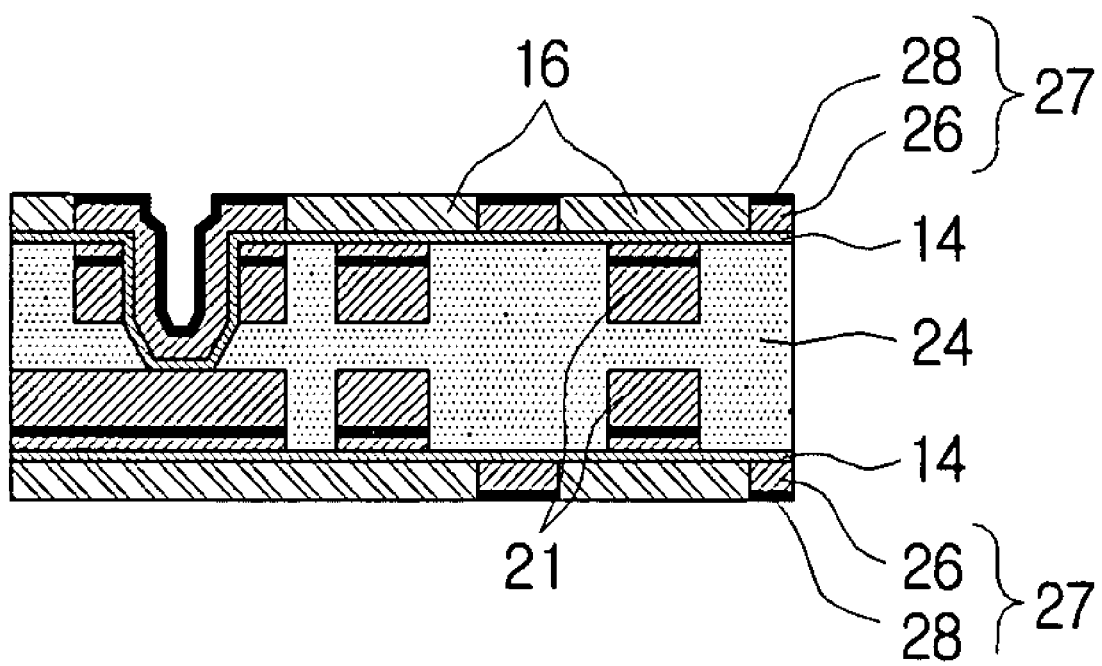

According to the method described above, a conductive relievo pattern 21, in which the first plating layer, first metal layer, and second plating layer are stacked sequentially, may be formed on each seed layer 14 of the two carriers 12 in correspondence with a first circuit pattern 30. When the carriers 12 are stacked and pressed onto both surfaces of the insulator 24, with the surface of each of the two carriers 12 having a conductive relievo pattern 21 facing either surface of the insulator 24, and then the two carriers 12 are removed, the conductive relievo patterns 21 can each be buried in either surface of the insulator 24 (FIGS. 3A, 3B, and 3C).

When a conductive relievo pattern 21 is transcribed in either surface of the insulator 24, a conduction pattern 27 may be formed, in which a third plating layer 26 and a second metal layer 28 are stacked sequentially, on either surface of the insulator 24 to correspond to a second circuit pattern 32.

Figure 3F:
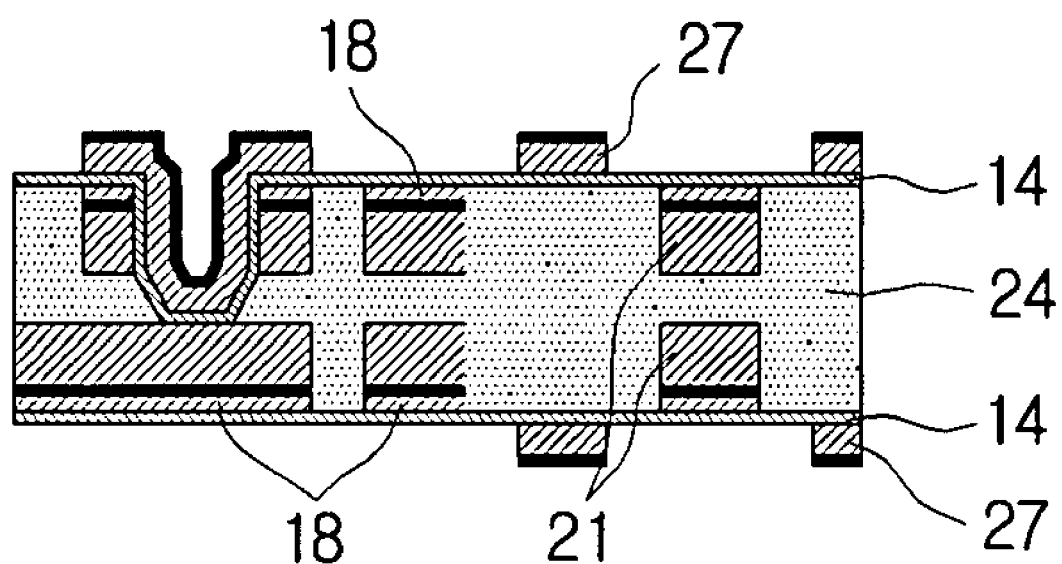
Figure 3G:
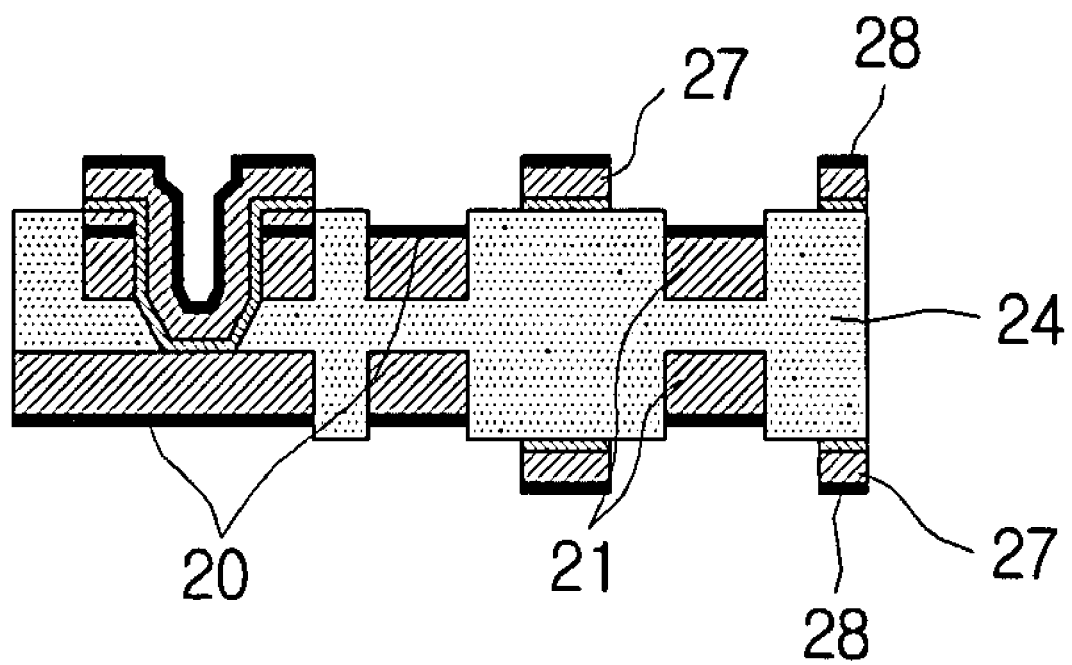

That is, intaglio patterns corresponding to the second circuit patterns 32 may be formed by selectively forming plating resist 16 on both surfaces of the insulator 24 (FIG. 3D), and the third plating layers 26 and second metal layers 28 may be stacked in order by performing electroplating (FIG. 3E), after which the plating resist 16 may be removed to form the conduction patterns 27 corresponding to the second circuit patterns 32 on the surfaces of the insulator 24 (FIG. 3F).

Figure 3H:
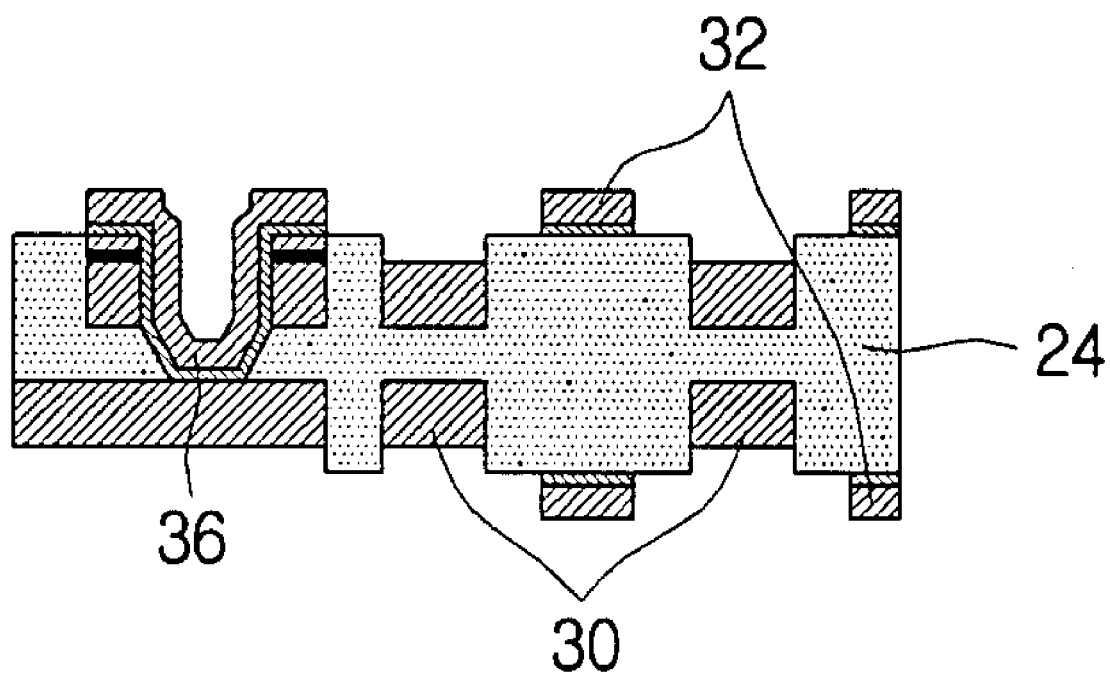

Afterwards, by removing the first plating layers 18 and the seed layers 14 (FIG. 3G), and removing the first metal layers 20 and second metal layers 28, a circuit board may be manufactured that has first circuit patterns 30 buried to a particular depth in both surfaces of the insulator 24 and second circuit patterns 32 formed on both surfaces of the insulator 24 (FIG. 3H).

After removing the carriers 12 to bury the conductive relievo patterns 21 in both surfaces of the insulator 24, and before forming the conduction patterns 27 on both surfaces of the insulator 24, an operation can be included of processing a via hole 34 in the insulator 24 and then forming a seed layer 14 in the via hole 34 to perform plating in the via hole 34. In this case, the conductive relievo patterns 21 buried in both surfaces of the insulator 24 can be designed to have their terminals facing each other, in order for an easier processing of the via hole 34.

After processing the via hole 34 in which the seed layer 14 is formed, intaglio patterns corresponding to the second circuit patterns 32 may be formed including the areas where the via 36 is formed. By forming the intaglio patterns including the via 36 forming areas and then stacking the third plating layers 26 and second metal layers 28 in the intaglio patterns, interlayer conduction can readily be implemented for all of the layers.

Afterwards, solder resist can be applied to protect the surfaces of the board as well as the circuits exposed at the outer layers. Also, a gold plating process may be performed for pad portions to which a semiconductor chip, etc., will be coupled.

FIG. 4 is a flowchart illustrating a method of manufacturing a circuit board according to an embodiment of the present invention. Referring to FIG. 4, in operation S100, a conductive relievo pattern, formed by sequentially stacking a first plating layer, a first metal layer, and a second plating layer, may be formed in correspondence with the first circuit pattern on a seed layer stacked on a carrier.

Forming the conductive relievo pattern having the first plating layer, first metal layer, and second plating layer stacked in order on the seed layer stacked on the carrier, such that the conductive relievo pattern is in correspondence with the first circuit pattern, may be performed as follows. Plating resist may be formed selectively on the seed layer to form an intaglio pattern corresponding to the first circuit pattern, and the first plating layer, first metal layer, and second plating layer may be stacked in order within the intaglio pattern by performing electroplating for each using the seed layer as an electrode, after which the plating resist may be removed to form a conductive relievo pattern that corresponds with the first circuit pattern.

The method of forming the conductive relievo pattern on the seed layer of the carrier to correspond with the first circuit pattern may include coating a photosensitive material on the seed layer of the carrier, fabricating a photomask in correspondence with the first circuit pattern, and afterwards positioning the photomask on the seed layer coated with photosensitive material and exposing to ultraviolet rays. After the exposure, the non-cured portions of the photosensitive material may be developed using, for example, developing liquid, to form the intaglio pattern on the seed layer that matches the first circuit pattern (S110).

By selectively exposing and developing a photosensitive film layer stacked on the seed layer of the carrier, the non-cured portions of the photosensitive film layer that have not been exposed due to the photomask are removed from the seed layer of the carrier, whereas the portions of the photosensitive film layer that have been cured due to the exposure remain, whereby an intaglio pattern can be formed that corresponds with the first circuit pattern.

When the intaglio pattern corresponding to the first circuit pattern is formed on the seed layer of the carrier, the first plating layer may first be formed in the intaglio pattern by performing electroplating using the seed layer as an electrode. When the first plating layer is stacked, the first metal layer may be stacked by electroplating. The first metal layer may include at least one or more of tin and nickel. Here, the first plating layer and first metal layer may be formed only in a portion of the intaglio pattern. When the first plating layer and the first metal layer of a particular depth are stacked in the intaglio pattern, the second plating layer may be stacked on top. The second plating layer may later become the first circuit pattern when the first plating layer and the first metal layer are removed (S120).

After the first plating layer, first metal layer, and second plating layer are stacked in order in the intaglio pattern, the plating resist may be removed to form the conductive relievo pattern on the seed layer of the carrier in correspondence to the first circuit pattern (S130).

In operation S200, the surface of the carrier on which the conductive relievo pattern is formed may be stacked to face the insulator and compressed together such that the conductive relievo pattern is impressed into the insulator 24.

In operation S300, the carrier may be removed such that the conductive relievo pattern impressed into the insulator 24 is transcribed into the surface of the insulator. Here, the seed layer that used to be stacked on the surface of the carrier may be transferred as well.

In operation S400, a conduction pattern, made by sequentially stacking the third plating layer and the second metal layer, may be formed to correspond to a second circuit pattern on the surface of the insulator to which the conductive relievo pattern has been transcribed.

After forming an intaglio pattern corresponding to the second circuit pattern by selectively forming plating resist on the surface of the insulator (S410), and performing electroplating to stack the third plating layer and the second metal layer in order (S420), the plating resist may be removed to form a conduction pattern on the surface of the insulator that corresponds to the second circuit pattern (S430). The conduction pattern can be formed to have a portion overlap the conductive relievo pattern impressed in the surface of the insulator. By thus having a portion overlap the conductive relievo pattern, the first circuit pattern and second circuit pattern formed in subsequent processes can be electrically connected. That is, in order for a portion of the conduction pattern to overlap a portion of the conductive relievo pattern impressed in the surface of the insulator, a portion of the intaglio pattern corresponding to the second circuit pattern can be formed above the conductive relievo pattern, and the third plating layer and the second metal layer can be stacked in the intaglio pattern, so that a portion of the conductive relievo pattern and a portion of the conduction pattern overlap and become electrically connected.

In operation S500, the first plating layer and the seed layer may be removed. The first plating layer can be formed by electroplating using the seed layer as an electrode, where the first plating layer and the seed layer can be made from the same metal so that they can be removed simultaneously by a single instance of etching. Here, the first metal layer and second metal layer can be made from a metal material different from the seed layer, to function as a resist to the etching of the first plating layer and seed layer, so that the areas where the first metal layer or the second metal layer are formed may not be etched.

In operation S600, the first metal layer and the second metal layer may be removed. If the first metal layer and the second metal layer are made from different metal materials, an etchant can be applied respectively for each metal to remove the metal layers individually, but if the first metal layer and second metal layer are of the same metal, they can be removed simultaneously by one instance of etching. To reduce the time for the etching process, it may be desirable to form the first and second metal layers from the same metal.

As the first plating layer, seed layer, and first metal layer are removed, a level difference can be formed commensurate to the height of the first plating layer and the first metal layer, and the second plating layer can be buried in the insulator by a particular depth to form the first circuit pattern. Also, as the second metal layer is removed, the third plating layer can be formed on the surface of the insulator to form the second circuit pattern.

When the first circuit pattern and the second circuit pattern are formed with a difference in level of a particular distance, electrical short-circuiting can be avoided, even when the first circuit pattern is formed directly adjacent to the second circuit pattern, whereby the circuit board can be manufactured that has circuit patterns formed in high density.

According to certain embodiments of the invention as set forth above, a circuit board can be manufactured that has high-density circuit patterns without an increased amount of insulator, by forming a double layer of circuit patterns from a first circuit pattern buried in the insulator and a second circuit pattern formed on the outer layer of the insulator.

Furthermore, a circuit board having a multi-layered structure can be formed without an increased amount of insulator, to not only reduce the overall thickness of the circuit board but also save on raw materials.

In addition, as the circuits can be formed inside the board, there can be high adhesion between the circuits and the board for less likelihood of peeling of the circuits, and heat can readily be released from the board.

While the spirit of the invention has been described in detail with reference to particular embodiments, the embodiments are for illustrative purposes only and do not limit the invention. It is to be appreciated that those skilled in the art can change or modify the embodiments without departing from the scope and spirit of the invention.

What is claimed is:

1. A method of manufacturing a circuit board, the method comprising:
    forming a conductive relievo pattern on a seed layer stacked on a carrier, the conductive relievo pattern comprising a first plating layer, a first metal layer, and a second plating layer stacked sequentially in correspondence with a first circuit pattern;
    stacking and pressing together the carrier and an insulator, the carrier positioned such that a surface of the carrier having the conductive relievo pattern formed thereon faces the insulator;
    transcribing the conductive relievo pattern onto the insulator by removing the carrier;
    forming a conduction pattern on a surface of the insulator having the conductive relievo pattern transcribed thereon, the conduction pattern comprising a third plating layer and a second metal layer stacked sequentially in correspondence with a second circuit pattern;
    removing the first plating layer, the seed layer, the first metal layer and the second metal layer; and
    forming a height difference between an upper surface of the first circuit pattern buried in the insulator and a lower surface of the second circuit pattern formed on the insulator.

2. The method of claim 1, wherein the first plating layer, the second plating layer, and the third plating layer are formed from a same metal material as that of the seed layer, and
    the first metal layer and the second metal layer are formed from a different metal material from that of the seed layer.

3. The method of claim 2, wherein the seed layer comprises copper (Cu), and the first metal layer and the second metal layer comprise at least one or more of tin (Sn) and nickel (Ni).

4. The method of claim 1, wherein the forming of the conductive relievo pattern comprises:
    forming an intaglio pattern corresponding to the first circuit pattern by selectively forming plating resist on the seed layer;
    sequentially stacking the first plating layer, the first metal layer, and the second plating layer in the intaglio pattern by performing electroplating respectively; and
    removing the plating resist.

5. The method of claim 1, wherein the carrier is a metal plate, and
    the transcribing is performed by etching the metal plate.

6. The method of claim 1, wherein the forming of the conduction pattern comprises:
    forming an intaglio pattern corresponding to the second circuit pattern by selectively forming plating resist on the surface of the insulator;
    sequentially stacking the third plating layer and the second metal layer in the intaglio pattern by performing electroplating respectively; and
    removing the plating resist.

7. The method of claim 1, wherein the forming of the conductive relievo pattern comprises:
    forming a conductive relievo pattern on each of the seed layers of two carriers,
    the stacking and pressing comprises:
    stacking and pressing the two carriers onto either surface of the insulator, each of the carriers positioned such that a surface of each of the carriers having the conductive relievo pattern formed thereon faces the insulator,
    the transcribing comprises:
    removing the two carriers,
    and the forming of the conduction pattern comprises:
    forming a conduction pattern on either surface of the insulator.

8. The method of claim 7, further comprising, before the forming of the conduction pattern on either surface of the insulator:
    forming a via hole in the insulator; and
    forming a seed layer in the via hole,
    and further comprising, after the forming of the conduction pattern on either surface of the insulator:
    selectively applying solder resist on the insulator.

* * * * *